(12) United States Patent
Yamamoto et al.

(10) Patent No.: US 7,851,053 B2
(45) Date of Patent: Dec. 14, 2010

(54) COPPER CLAD LAMINATE

(75) Inventors: Takuya Yamamoto, Ageo (JP); Seiji Nagatani, Ageo (JP); Masahiko Nakano, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 142 days.

(21) Appl. No.: 12/036,537

(22) Filed: Feb. 25, 2008

(65) Prior Publication Data

US 2008/0171220 A1   Jul. 17, 2008

Related U.S. Application Data

(62) Division of application No. 09/925,740, filed on Aug. 10, 2001, now Pat. No. 7,358,189.

(30) Foreign Application Priority Data

Aug. 25, 2000   (JP)   ............................ 2000-255490

(51) Int. Cl.
B32B 27/00   (2006.01)
(52) U.S. Cl. .................... 428/220; 428/411.1; 428/416; 428/606; 428/607
(58) Field of Classification Search ................. 428/220, 428/411.1, 416, 606, 607
See application file for complete search history.

(56) References Cited

U.S. PATENT DOCUMENTS

| | | |
|---|---|---|
| 3,936,548 A | 2/1976 | Konicek |
| 4,313,995 A | 2/1982 | Delgadillo |
| 4,751,146 A | 6/1988 | Maeda et al. |
| 4,917,758 A | 4/1990 | Ishizuka et al. |
| 5,049,221 A | 9/1991 | Wada et al. |
| 5,102,749 A | 4/1992 | Enloe et al. |
| 5,153,050 A | 10/1992 | Johnston |
| 5,153,077 A | 10/1992 | Kashiba et al. |
| 5,254,191 A | 10/1993 | Mikeska et al. |
| 5,436,301 A | 7/1995 | Nishimura et al. |
| 5,569,545 A * | 10/1996 | Yokono et al. .............. 428/626 |
| 5,583,320 A | 12/1996 | Eriguchi et al. |
| 5,674,611 A | 10/1997 | Saida et al. |
| 5,679,230 A | 10/1997 | Fatcheric et al. |

(Continued)

FOREIGN PATENT DOCUMENTS

EP   1 167 581 A1   1/2002

(Continued)

OTHER PUBLICATIONS

Shackelford, "Introduction to Materials Science for Engineers", 2nd Edition, p. 273.

Primary Examiner—David R Sample
Assistant Examiner—Lawrence D Ferguson
(74) Attorney, Agent, or Firm—Roberts & Roberts, LLP

(57) ABSTRACT

To reduce warping of a copper clad laminate coated with copper foils of different thicknesses on both sides, and thereby to improve production efficiency of the printed-wiring boards, there is provided a copper clad laminate coated with copper foils of different thicknesses on both sides, wherein a first copper foil on one side of the laminate is not recrystallizable by hot pressing for production of said laminate and a second foil on the other side is recrystallizable by the hot pressing and thicker than the first foil.

15 Claims, 3 Drawing Sheets

(a) Size of Constituent Material before Hot Pressing (b) Size of Constituent Material Shrank after Hot Pressing

U.S. PATENT DOCUMENTS

| | | | |
|---|---|---|---|
| 5,785,789 | A | 7/1998 | Gagnon et al. |
| 6,027,826 | A | 2/2000 | DeRochemont et al. |
| 6,197,433 | B1 | 3/2001 | Hatano |
| 6,231,742 | B1 | 5/2001 | Sano et al. |
| 6,270,889 | B1 | 8/2001 | Kataoka et al. |
| 6,320,140 | B1 | 11/2001 | Enomoto |
| 6,479,170 | B2 | 11/2002 | Takahashi et al. |
| 6,489,035 | B1 | 12/2002 | Wang et al. |
| 6,649,274 | B1 | 11/2003 | Taenaka et al. |
| 6,652,962 | B1 | 11/2003 | Sato et al. |
| 6,660,406 | B2 | 12/2003 | Yamamoto et al. |
| 6,777,108 | B1 | 8/2004 | Obata et al. |
| 2001/0008091 | A1 | 7/2001 | Takahashi et al. |
| 2001/0038911 | A1 | 11/2001 | Tsunashima et al. |
| 2002/0005249 | A1 | 1/2002 | Kuwako et al. |
| 2002/0192486 | A1 | 12/2002 | Chen et al. |

FOREIGN PATENT DOCUMENTS

| | | | |
|---|---|---|---|
| JP | 58-140240 | A | 8/1983 |
| JP | 5-309782 | A | 11/1993 |
| JP | 7-22731 | A | 1/1995 |
| JP | 7-32544 | A | 2/1995 |
| JP | 10 34820 | A | 2/1998 |

* cited by examiner (a) Size of Constituent Material before Hot Pressing (b) Size of Constituent Material Shrank after Hot Pressing

COPPER CLAD LAMINATE

This application is a divisional of Ser. No. 09/925,740 filed Aug. 10, 2001, which claims the benefit of Japanese Patent Application No. 2000-255490 filed on Aug. 25, 2008, the disclosure of which is incorporated herein in its entirety by reference.

BACKGROUND OF THE INVENTION

1. Field of the Invention

This invention relates to a copper clad laminate useful for, e.g., production of printed-wiring boards, more particularly, to a copper clad laminate with reduced warping and torsion generated during processing.

2. Description of the Prior Art

A copper clad laminate has been produced by pressing a copper foil as an inorganic material and belonging to a metallic material and an organic material as an insulation layer constituent, represented by prepreg, to adhere them to each other under heating. Therefore, a copper clad laminate is composed of copper foil/insulation layer constituent material/copper foil as a basic structure, and is normally produced by hot-pressing the layered structure at around 180° C.

The hot-pressed copper clad laminate has various problems. One of the problems is a phenomenon known as warping (hereinafter simply referred to as "warping") of the laminate itself, observed when it is taken out of the press on completion of hot-pressing, cooling and disassembling the built-up pressed body. Another problem is a phenomenon known as torsion (hereinafter simply referred to as "torsion") of the copper clad laminate as a whole. This phenomenon is considered to be one type of the warping phenoma.

The warped or distorted copper clad laminate should cause various problems, when used for production of printed-wiring boards without being corrected, in all of the steps of surface finishing, registration and etching of an etching process. The resultant circuit with copper foil cannot keep required precision, making it almost impossible to form a fine-pitch circuit.

The persons skilled in the art have been trying to correct a warped or distorted copper clad laminate by adding a post-treatment step, such as heat treatment referred to as after-baking or keeping the laminate under load for an extended period to make it flat.

Addition of such a post-treatment step to correct the warping or torsion of the copper clad laminate leads to increased production cost. Cost increase should be avoided as far as possible for Japanese manufacturers to keep their competitiveness in the world market.

The manufacturers have been taking various countermeasures to prevent warping and torsion, considering that these problems are caused by strains generated within the laminate, resulting from difference between the constituent layers in thermal expansion behavior during a hot-pressing process and in contraction behavior during a cooling process. These countermeasures include (1) changing material for a mirror plate used during the hot-pressing process to the one having a coefficient of thermal expansion closer to that of copper foil, (2) controlling the mirror plate surface roughness in such a way to minimize the effects of thermal expansion or contraction behavior of the mirror plate on a deformation behavior of the copper foil, (3) changing a glass-epoxy base, commonly referred to as a prepreg, used as an insulation layer constituent; for example, changing glass material for a glass cloth, shape of glass fibers, or modification of the epoxy resin, and (4) changing thermal hysteresis for a hot-pressing process. These countermeasures have produced results to some extent.

In actuality, however, the above countermeasures have failed to completely correct warping or torsion of copper clad laminates. These problems are almost solved, when a double-sided copper clad laminate is coated with a copper foil of the same quality and same thickness on both sides, but not solved completely when a foil for one side differs in thickness from that for the other side.

Recently, the double-sided copper clad laminate is frequently coated with copper foils of different thicknesses, as production methods of printed-wiring boards are diversified. Therefore, the market is strongly demanding the effective means for solving these problems.

BRIEF SUMMARY OF THE INVENTION

The inventors of the present invention have found, after having extensively studied to solve the above problems, that warping and torsion of copper clad laminates can be effectively prevented, even when it is coated with copper foils of different thicknesses on both sides, by devising a type of the copper foil. The present invention is described below, beginning with explanation of the concept of material strength as the standard for selecting a copper foil.

The inventors of the present invention have come to believe, after having screened various mechanical calculation models to compare the results with the observed warps of the copper clad laminates actually prepared, that an extent of warping occurrence can be predicted very efficiently in a relative sense even by most simple mechanical calculation model described below.

The copper clad laminate used for the mechanical calculation is represented by a simple model shown in FIG. 1, coated with a copper foil of different thickness on each side. The copper foils are placed on an insulation layer constituent material (assumed to be a resin) of almost the same size before hot pressing for producing the copper clad laminate. FIG. 1A shows a side view of a copper clad laminate. FIG. 1B shows a side view of a hot-pressed laminate, where a resin layer cured to be an insulation layer shrinks more than each of copper foils inward. The resin layer, made of prepreg or the like, is basically referred to as insulation layer constituent material before curing, and an insulation resin layer or simply resin layer after curing.

When the laminate of the copper foil/insulation layer constituent material/copper foil structure is hot-pressed, each layer can freely expand or contract to an extent determined by quantity of heat supplied, so long as it remains liquid before the insulation layer constituent resin is cured. However, its free expansion or contraction behavior is limited under restriction resulting from differences between the adjacent layers in thermal expansion or contraction, as the insulation layer constituent resin is cured. It is most important to note that copper for the foil and insulation layer constituent resin greatly differ from each other in coefficient of contraction. This difference is of particular importance in production of the laminate, because the resin is considered to have generally several times larger coefficient than copper.

Therefore, each of the copper foils adhered to the insulation resin layer is kept under a compression stress from the contracting resin layer, whereas the resin layer is kept under a tensile stress contrary to its contracting behavior, when the resin for the insulation layer is cured. This generates a strain within each of the copper clad laminate layer to cause the warping phenomenon. This problem should be solved ideally when the copper foil contracts similarly to the resin as the base, which, however, is unattainable for metallic materials.

Therefore, the inventors of the present invention have studied what properties of the copper foil have potentially large effects on the warping phenomenon using the above-described mechanical calculation with a model schematically illustrated in FIG. 2. In this study, it is assumed that the copper clad laminate is composed of layers each at an equilibrium for its behavior, which is followed individually, while neglecting the effects of a nodular-treated surface, a contact surface between a copper foil and an insulation layer constituted, to produce the anchor effects.

First, behavior of the copper foil side is discussed. The copper foil originally has a length of $L_c$, which is contracted to L when the foil is subjected to a compressive stress as the copper clad laminate constituent. Strictly speaking, length L of the copper foil means that of the foil appearing at the section of the copper clad laminate, as illustrated in FIG. 2. The strain of the copper foil, subjected to a compressive load as the copper clad laminate constituent, is given by formula (1) of Formula I, based on the copper foil length $L_C$ before contraction, and the compressive stress within the foil is given by formula (2) of Formula 1, wherein $t_c$ is copper foil thickness, $w_c$ is copper foil width, and $E_c$ is Young's modulus of the foil. In this specification, Young's modulus of the copper foil means the maximum slope of the stress-strain curve obtained by the tensile test of the foil. It is determined by differentiating the curve. In the case of copper in the form of foil, the value of Young's modulus depends on the conditions for preparation of the stress-strain curve, especially rod speed of the tensile tester. The inventors of the present invention set a rod speed at 50 µm/min. and a distance between the marked lines at 50 mm to determine the modulus.

Formula 1

Compressive strain in the copper foil:

$$\epsilon_c = (L_c - L)/L_c \quad (1)$$

Compressive load the copper foil is exposed to:

$$F_c = t_c \cdot w_c \cdot \sigma_c = t_c \cdot w_c \cdot E_C(L_c-L)/L_c \quad (2)$$

When contraction of the base side is considered, the resin as the insulation layer constituent material contracts more than the copper foil, if it freely contracts. It can be assumed, when it is adhered to the nodular-treated surface of the copper foil to form the laminate, the tensile stress corresponding to the difference in contracted length between the adjacent layers is generated within the cured resin. However, it is almost impossible to predict the internal stress generated within the resin by restricting its natural contraction to stop its contraction while it is being cured. Therefore, the inventors of the present invention have assumed in this simulation that the resin as the insulation layer constituent is stretched from $L_R$ to L, where $L_R$ is the length for which the resin freely contracts and L is the length of the insulation resin layer in the actual copper clad laminate (i.e., the length of the contracted copper foil). The tensile load generated in the cured resin layer as the insulation layer constituent material is given by formula (3) in Formula 2, similar to the above-described formulae (1) and (2), wherein $t_R$ is thickness of the resin layer as the insulation layer constituent material, $w_R$ is width of the insulation layer constituent material, and $E_R$ is Young's modulus of the cured resin:

Formula 2

Tensile strain in the cured resin:

$$\epsilon_R = (L_R - L)/L_R$$

Tensile load the cured resin is exposed to:

$$F_R = t_R \cdot w_R \sigma_R = t_R \cdot w_R \cdot E_R(L_R-L)/L_R \quad (3)$$

Assuming that an equilibrium is produced in mechanical balances at the interface between the copper foil and one side of the cured resin layer supporting the copper foil, $F_c$ and $F_R$ are balanced with each other working in the opposite directions, i.e., there is a relationship $F_c + F_R = 0$. Therefore, combining formula (2) with formula (3) yields Formula 3:

Formula 3

$$\frac{F_C}{F_R} = \frac{t_C \cdot w_C \cdot E_C(L_C - L)/L_C}{t_R \cdot w_R \cdot E_R(L_R - L)/LR}$$

wherein, there is a relationship $F_c/F_R = -1$, which means there is a relationship $w_c = w_R$ on the assumption that the copper foil and insulation layer constituent material having the same dimensions except thickness are hot-pressed. Moreover, assuming that contraction of the copper foil and insulation layer constituent material is sufficiently small as compared with the total length, there is a relationship $L_C/L_R ≒ 1$. Therefore, Formula 3 is reduced to Formula 4:

Formula 4

$$\frac{L - L_R}{L_C - L} = \frac{t_C \cdot E_C}{t_R \cdot E_R} \quad (4)$$

Let's consider the effects of copper foil thickness ($t_C$) and Young's modulus ($E_C$) on contraction behavior of the copper foil using formula (4) by varying the thickness and modulus while keeping the resin characteristics unchanged. First, for the effect of copper foil thickness ($t_C$), increasing copper foil thickness ($t_C$) increases $(L-L_R)/(L_C-L)$, and hence decreases ($L_C-L$), when Young's modulus ($E_C$) of the copper foil is set constant, because $t_R \cdot E_R$ and $(L-L_R)$ are constant on the assumption that the resin characteristics are constant. Therefore, it is considered that the copper foil contracts less as its thickness increases, and so is vice versa as its thickness decreases. As a result, the copper clad laminate coated with copper foils on both sides tend to warp more when these foils have a different thickness, because they contract to a different extent.

Next, the effect of Young's modulus ($E_C$) on contraction of the copper foil is considered. Increasing Young's modulus ($E_C$) of the copper foil increases $(L-L_R)/(L_C-L)$, as is the case with foil thickness, and hence decreases ($L_C-L$), when foil thickness ($t_C$) is set constant, because $t_R \cdot E_R$ and $(L-L_R)$ are constant on the assumption that the resin characteristics are constant. Therefore, it is considered that the copper foil contracts less as its Young's modulus increases, and so is vice versa as its Young's modulus decreases. As a result, the copper clad laminate coated with copper foils on both sides tend to warp more when these foils have a different Young's modulus, because they contract to a different extent.

It is therefore considered, based on the above discussion, that decreasing thickness of the thicker copper foil on one side to a level close to that of the thinner one on the other side as far as possible and, at the same time, use of a copper foil of lower Young's modulus for the thicker one are effective for solving the problem of warping of the copper clad laminate coated with copper foils on both sides.

The inventors of the present invention have considered, based on the relationship of formula (4), to what extent contraction of the base is limited by the copper foil it supports as compared with the length for which it freely contracts using Formula 5, or to what extent the cured resin is extended by the copper foil from the length for which it freely contracts on the assumption that the cured resin is elastic.

Formula 5

Substituting $K_C$ for $E_C/(t_R \cdot E_R)$, formula (4) is reduced to formula (5):

$$\frac{L - L_R}{L_C - L} = K_C \cdot t_C \quad (5)$$

The formula (5) can be changed into formula 6 as shown in Formula 6:

Formula 6

$$L - L_R = K_C \cdot t_C \cdot (L_C - L) \quad (6)$$
$$(1 + K_C \cdot t_C)L = K_C \cdot t_C \cdot L_C + L_R$$
$$\therefore L = (K_C \cdot t_C \cdot L_C + L_R)/(1 + K_C \cdot t_C)$$
$$= [L_C(1 + K_C \cdot t_C) + (L_R - L_C)]/(1 + K_C \cdot t_C)$$
$$= L_C + (L_R - L_C)/(1 + K_C \cdot t_C)$$

The formula (6) is changed into the formula (7) to find the expansion of the base ($L-L_R$), where $\Delta L$ is the difference between the cured resin and copper foil in contracted length, $L_C - L_R$:

Formula 7

$$L - L_R = (L_C - L_R) + (L_R - L_C)/(1 + K_C \cdot t_C) \quad (7)$$
$$= \Delta_L[1 - 1/(1 + K_C \cdot t_C)]$$

The formula (7) is changed into the formula (8) by substituting $E_C/(t_R \cdot E_R)$ for $K_C$:

$$L - L_R = \Delta_L[1 - 1/\{1 + t_C \cdot E_C/t_R \cdot E_R)\}] \quad (8)$$

The formula (8) indicates that the cured resin in the copper clad laminate is elongated/deformed more as the copper foil increases in each of thickness ($t_C$) and Young's modulus ($E_C$). Therefore, for the copper clad laminate coated with copper foils of different thicknesses, it is very important to change designs in such a way to decrease the thickness of these foils as far as possible, in order to control warping of the laminate. Use of a copper foil of a lower Young's modulus for the thicker one is also effective, when the above design changes are impractical. These are the effective approaches viewed from the material of copper foil to control warping of the laminate.

Warping of the copper clad laminate is simulated, based on the above formulae, using the model shown in FIG. 2, wherein thickness of the laminate, which is total thickness of the copper foil/insulation layer constituent material/copper foil, is represented by that of the cured resin. It is also assumed that warp of the resin layer shown in FIG. 1 is sufficiently small as compared with total length of the base and has a radius "r." Length of the warp inside at the upper resin layer side is given by $r\theta$ and that of the warp outside at the lower resin layer side by $(r+t_R)\theta$, wherein $t_R$ is a thickness of the resin layer and $\theta$ is circumferential angle of the warp. Therefore, the difference in length between the upper and lower sides is $(r+t_R)\theta - r\theta$, or $t_R\theta$.

There is a relationship $(r+t_R/2)\theta = s$, wherein "s" is the inherent length of the resin layer. Assuming that $t_R$ is sufficiently small as compared with "r," the above relationship can be reduced to $r\theta = s$. Therefore, the difference in length between the upper and lower sides can be given by the following formula:

$$t_R \theta = (s \cdot t_R)/r \quad (9)$$

Length which the copper foil on the copper clad laminate is considered to expand the resin layer is given by the above described formula (8). It can be therefore considered that the difference between lengths the copper foils of different thicknesses expand the resin layer is given by the formula (9). This relationship is represented by the formula (10):

Formula 8

$$\frac{s \cdot t_R}{r} = \Delta_{L_1}\left[1 - \frac{1}{1 + t_{C1} \cdot E_{C1}/(t_R \cdot E_R)}\right] - \Delta_{L_2}\left[1 - \frac{1}{1 + t_{C2} \cdot E_{C2}/(t_R \cdot E_R)}\right] \quad (10)$$

wherein, $\Delta L_1$ is a dimensional difference between the thicker copper foil and resin layer, whereas $\Delta L_2$ is that between the thinner copper foil and resin layer, on the assumption that each freely undergoes the dimensional change.

$\Delta L_1$ and $\Delta L_2$ are also given by the following relationships: $\Delta L_1 = \alpha_1 \cdot s$ and $\Delta L_2 = \alpha_2 \cdot s$, wherein $\alpha_1$ is a difference in coefficient of contraction between the thicker copper foil and resin, whereas $\alpha_2$ is that between the thinner copper foil and resin layer, on the assumption that each freely undergoes dimensional change. Substituting the above relationships in the formula (10) yields the formula (11):

Formula 9

$$r = \frac{t_R}{\alpha_1\left[1 - \frac{1}{1 + t_{C1} \cdot E_{C1}/(t_R \cdot E_R)}\right] - \alpha_2\left[1 - \frac{1}{1 + t_{C2} \cdot E_{C2}/(t_R \cdot E_R)}\right]} \quad (11)$$

The radius "r" given by the formula (11) is used to find out the warp "a" of the copper clad laminate, based on the relationship shown in FIG. 3. Referring to FIG. 3, $\Delta OCM$ and $\Delta CEA$ are similar to each other, wherein O is the center of the arc having a radius "r," C is the center of the copper clad laminate, E is one end of the base, M is the middle point of the line CE, and A is the point right under the point E.

Therefore, there holds a relationship $x/r = a/2x$, wherein "x" is a distance between the points C and M, and "a" is a distance (corresponding to the warp) between the points E and A, leading to a relationship $a = 2 \cdot x^2/r$. It can be assumed that the radius "r" is sufficiently large and the point M is at the quarter of length of the copper clad laminate, which leads to a relationship $x = s/4$. Therefore, a relationship $a = s^2/8r$ holds. Substituting the relationship of formula (11) in the above relationship allows to find out the warp by formula (12) of Formula 10. The warp given by formula (12) should be normally handled as a relative value, not as an absolute value. For it to be handled as an absolute value, it is necessary to take into consideration other factors, e.g., prepreg type and hot-pressing conditions, which needs calibration of an empirical relationship by, e.g., applying a specific coefficient to the actually observed warp of the copper clad laminate.

Formula 10

$$a = \frac{\alpha_1\left[1 - \frac{1}{1 + t_{C1} \cdot E_{C1}/(t_R \cdot E_R)}\right] - \alpha_2\left[1 - \frac{1}{1 + t_{C2} \cdot E_{C2}/(t_R \cdot E_R)}\right]}{Bt_R} \cdot s^2 \quad (12)$$

The inventors of the present invention have reached the present invention, based on the simulation works described above. The simulation results indicate that it is desirable for a copper clad laminate coated with copper foils of different thicknesses on both sides to (i) use a copper foil of a low Young's modulus for a thicker one and (ii) use copper foils which notably contract during hot pressing process, viewed from copper foils as a laminate materials.

Viewed from copper foils as the laminate materials, on the other hand, there is a problem whether or not a copper foil of a low Young's modulus is available. Copper foils broadly fall into two general categories, rolled and electrolyzed. There are copper foils easily recrystallized by heat for hot pressing for production of copper clad laminates, even they are electrolyzed (such a foil is hereinafter referred to as S-HTE foil). One example of such a foil is Mitsui Chemical's HTE foil. This type of foil is recrystallized by heat for hot-pressing, characterized in that it dimensionally contracts to an extent inconceivable with the conventional copper foil during the recrystallization process, at around 0.05% under the pressing conditions of 180° C. and 1 hour.

This recrystallizable copper foil has another characteristic of a lower Young's modulus after being recrystallized than the common copper foil. When thermally treated under the conditions of 180° C. and 1 hour, heat for which corresponds to that for hot pressing, the S-HTE foil has a low Young's modulus of around 40 to 50 GPa as compared with around 55 to 60 GPa of the common copper foil.

These considerations have led to development of the present invention. The present invention provides a copper clad laminate coated with copper foils of different thicknesses on both sides, wherein a first copper foil on one side of the laminate is not recrystallizable by hot pressing for production of the laminate and a second foil on the other side is recrystallizable by the hot pressing and thicker than the first foil.

The concept of the second, recrystallizable copper foil is not limited to the electrolyzed S-HTE foil but includes a rolled one. The rolled copper foil inherently has a large number of strains within the foil, generated during rolling process, and tends to recover under heating to be recrystallized very easily. The copper foil from tough pitch copper as the stock material is softened still more easily under heating to have a Young's modulus decreased to around 20 to 40 GPa. Therefore, even a rolled copper foil can be counted to be the material which can achieve the object of the present invention.

The present invention also provides a copper clad laminate coated with copper foils of different thicknesses on both sides, with a first copper foil on one side of the laminate and a second foil on the other side, wherein the copper foil is more recrystallizable by hot pressing and thicker than the first foil.

This laminate is coated with copper foils both recrystallizable under heating during hot pressing process. A copper foil can be controlled for recrystallization temperature, by controlling electrolytic solution properties in the case of electrolyzed foil, and by controlling rolling conditions, e.g., pressure decreasing rate, and heat treatment conditions in the case of rolled one. It is therefore possible to recrystallize these foils at a different rate, even when both are recrystallizable, and thereby to solve the problem of warping of the copper clad laminate coated with copper foils of different thicknesses on both sides, as the object of the present invention. It is essential in this case that the second foil is more recrystallizable than the first foil.

The present invention also provides a copper clad laminate coated with copper foils of different thicknesses on both sides, with a first copper foil on one side of the laminate and a second foil on the other side, wherein the second copper foil contracts more under heating for hot pressing and is thicker than the first foil. Such a configuration is based on the same reason as that for the above-described laminate.

The present invention also provides a copper clad laminate coated with copper foils of different thicknesses on both sides, with the first copper foil on one side of the laminate and the second foil on the other side, wherein the second copper foil has a lower Young's modulus and is thicker than the first foil. Such a configuration is based on the same reason as that for the above-described laminate.

MODES FOR CARRYING OUT THE INVENTION

Figure 1:
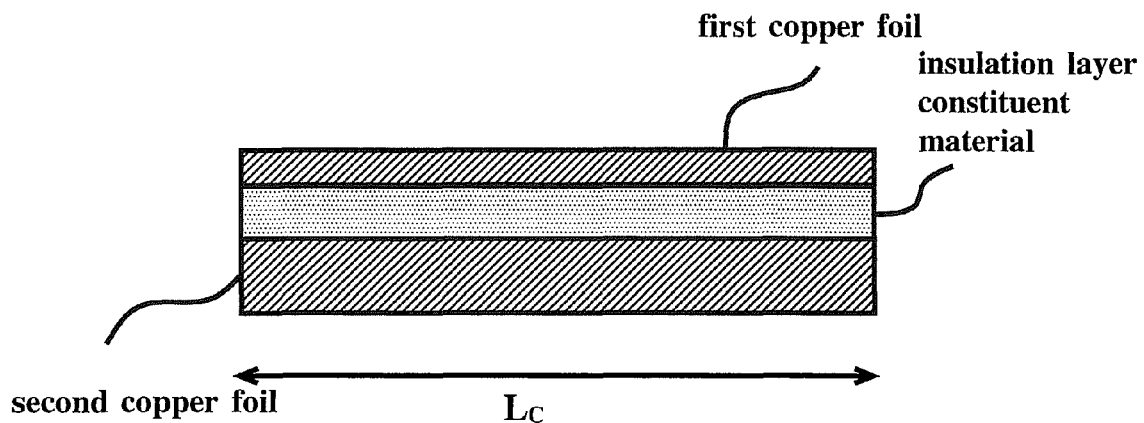
FIG. 1 illustrates a model of contraction behavior of copper clad laminate constituents for simulating warp of a base resin.
Figure 1:
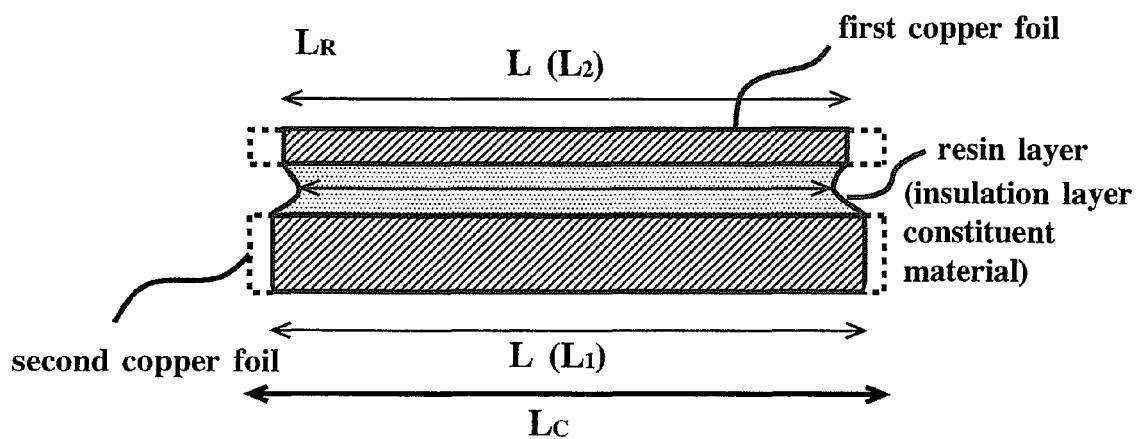
Figure 2:
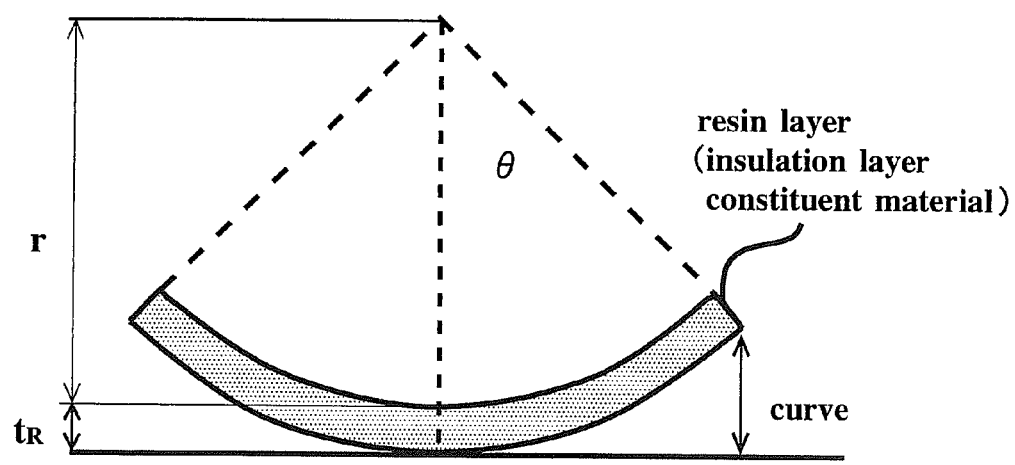
FIG. 2 illustrates models for simulating warp of the base resin.
Figure 3:
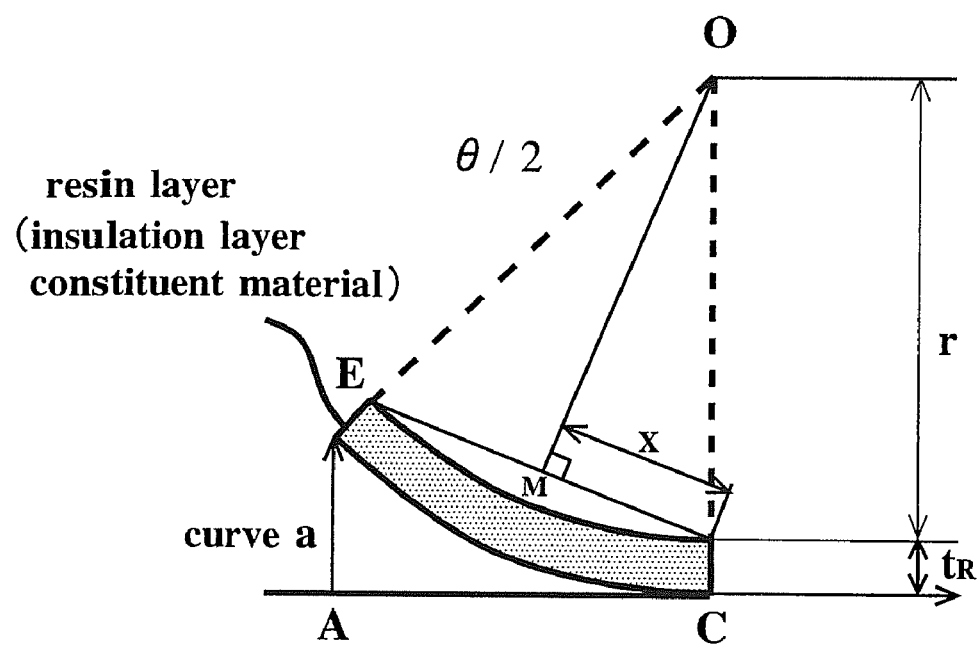
FIG. 3 illustrates models for simulating warp of the base resin.

The present invention and its effects are described more concretely by producing copper clad laminates of the present invention and measuring extents of their warping. In all of the embodiments described below, a 100-μm thick glass-epoxy base as the prepreg was coated with copper foils of different thicknesses on both sides by a hydraulic vacuum press under the conditions of 30 kg/cm² as forming pressure, 180° C. as heated press plate temperature and 60 minutes as main heating hour, and the resultant laminate was allowed to stand for cooling on completion of the pressing and withdrawn out of the press when its internal temperature reached 60° C., to prepare the 25 cm square copper clad laminate.

In the measurement of warp described below, a 25-cm square copper clad laminate was placed on a flat plate with one corner held, to measure distance for which the diagonal corner rose from the plate.

Example 1

The above-described base was coated with a 18 μm thick common electrolyzed copper foil showing little recrystallization on one side and a 70 μm thick S-HTE foil on the other side under the above-described pressing conditions, to prepare a copper clad laminate. The electrolyzed and S-HTE foils had Young's moduli of 60 and 44 GPa, respectively. The S-HTE foil in the laminate was observed to show good recrystallized conditions, with well-grown recrystallized grains.

A total of 30 copper clads were prepared and measured for warp by the above procedure. The minimum warp was 2 mm and maximum warp was 4 mm.

A total of 30 comparative copper clad laminates were also prepared by replacing the 70-µm thick S-HTE foil with a 70-µm thick common electrolyzed copper foil showing little recrystallization, and measured for the warp by the above procedure. The minimum warp was 12 mm and maximum warp was 17 mm. Thus, the copper clad laminate of the present invention clearly showed reduced warping.

Example 2

The above-described base was coated with a 18-µm thick common electrolyzed copper foil showing little recrystallization on one side and a 35-µm thick S-HTE foil on the other side under the above-described pressing conditions, to prepare the copper clad laminate. The electrolyzed and S-HTE foils had Young's moduli of 60 and 44 GPa, respectively. The S-HTE foil in the laminate was observed to show good recrystallized conditions, with well-grown recrystallized grains.

A total of 30 copper clads were prepared and measured for warp by the above procedure. The minimum warp was 0 mm and maximum warp was 2 mm.

A total of 30 comparative copper clad laminates were also prepared by replacing the 35-µm thick S-HTE foil with a 35-µm thick common electrolyzed copper foil showing little recrystallization, and measured for warp by the above procedure. The minimum warp was 7 mm and maximum warp was 10 mm. Thus, the copper clad laminate of the present invention clearly showed reduced warping.

It is also apparent, when the results of Example 1 are compared with those of Example 2, that replacing the 70-mm thick S-HTE foil with the same, 35-mm thick foil greatly reduces warp of the laminate.

Example 3

The above-described base was coated with a 35-µm thick common electrolyzed copper foil showing little recrystallization on one side and a 70-µm thick S-HTE foil on the other side under the above-described pressing conditions to prepare the copper clad laminate. The electrolyzed and S-HTE foils had Young's moduli of 57 and 44 GPa, respectively. The S-HTE foil in the laminate was observed to show good recrystallized conditions, with well-grown recrystallized grains.

A total of 30 copper clads were prepared and measured for warp by the above procedure. The minimum warp was 0 mm and maximum warp was 2 mm.

A total of 30 comparative copper clad laminates were also prepared by replacing the 70-µm thick S-HTE foil with a 70-µm thick common electrolyzed copper foil showing little recrystallization, and measured for the warp by the above procedure. The minimum warp was 5 mm and maximum warp was 8 mm. Thus, the copper clad laminate of the present invention clearly showed reduced warping.

The copper foil structures for the present invention minimizes warping of the copper clad laminate coated with copper foils on both sides, even when these foils are different in thickness, allowing the laminate to be handled more easily in the printed-wiring board production process subsequent to production of the laminate and greatly improving working efficiency.

The invention claimed is:

1. A copper clad laminate comprising:
    an insulation layer having a first and a second side and comprising a glass-epoxy prepreg,
    a first copper foil which is not recrystallized and of a first thickness attached to said first side,
    a second copper foil which is recrystallized and of a second thickness attached to said second side,
    wherein said second copper foil is (a) thicker, and (b) has a lower Young's modulus, than said first copper foil.

2. The copper clad laminate of claim 1, wherein the Young's modulus of said first copper foil is 1.1 times more than the Young's modulus of said second copper foil.

3. The copper clad laminate of claim 1 wherein the first copper foil has a thickness of at least 18 µm.

4. A hot pressed copper clad laminate comprising:
    an insulation layer constituent material having a first and second side, and comprising a glass-epoxy prepreg,
    wherein said first side is coated with a first non-recrystallized copper foil, and
    wherein said second side is coated with a second recrystallized copper foil, and
    wherein said second copper foil is thicker than said first copper foil.

5. The copper clad laminate of claim 4, wherein the Young's modulus of said first copper foil is 1.1 times more than the Young's modulus of said second copper foil.

6. The hot pressed copper clad laminate of claim 4 wherein the first recrystallized copper foil has a thickness of at least 18 µm.

7. A hot pressed copper clad laminate comprising;
    an insulation layer constituent material having a first and second side, and comprising a glass-epoxy prepreg,
    wherein said first side is coated with a first recrystallized copper foil, and
    wherein said second side is coated with a second recrystallized copper foil, and
    wherein said second copper foil is (a) thicker and (b) more recrystallized than said first copper foil.

8. The laminate of claim 7, wherein, after hot pressing, the Young's modulus of said first copper foil is 1.1 times more than the Young's modulus of said second copper foil.

9. The hot pressed copper clad laminate of claim 7 wherein the first recrystallized copper foil has a thickness of at least 18 µm.

10. A substantially non-warped copper clad laminate comprising:
    an insulation layer constituent material having a first and second side, and comprising a glass-epoxy prepreg,
    wherein said first side is coated with a first copper foil,
    wherein said second side is coated with a second copper foil,
    wherein said second copper foil is thicker than said first copper foil,
    and wherein said second copper foil is capable of contracting to a larger extent than said first copper foil during a hot pressing step.

11. The laminate of claim 10, wherein, after hot pressing, the Young's modulus of said first copper foil is 1.1 times more than the Young's modulus of said second copper foil.

12. The substantially non-warped copper clad laminate of claim 10 wherein the first copper foil has a thickness of at least 18 μm.

13. The substantially non-warped copper clad laminate of claim 10 which exhibits a maximum warp of 4 mm or less after a hot pressing step.

14. The substantially non-warped copper clad laminate of claim 10 which exhibits a maximum warp of 2 mm or less after a hot pressing step.

15. The substantially non-warped copper clad laminate of claim 10 which exhibits a warp of 0 mm after a hot pressing step.

* * * * *